US012772623B2

(12) United States Patent
Sannabe

(10) Patent No.: US 12,772,623 B2

(45) Date of Patent: Oct. 20, 2026

(54) LIGHT-EMITTING DEVICE

(71) Applicant: NICHIA CORPORATION, Anan (JP)

(72) Inventor: Shinsuke Sannabe, Itano-gun (JP)

(73) Assignee: NICHIA CORPORATION, Anan (JP)

( * ) Notice: Subject to any disclaimer, the term of this patent is extended or adjusted under 35 U.S.C. 154(b) by 423 days.

(21) Appl. No.: 18/552,982

(22) PCT Filed: Nov. 26, 2021

(86) PCT No.: PCT/JP2021/043388

§ 371 (c)(1),
(2) Date: Sep. 28, 2023

(87) PCT Pub. No.: WO2022/208996

PCT Pub. Date: Oct. 6, 2022

(65) Prior Publication Data

US 2024/0194834 A1 Jun. 13, 2024

(30) Foreign Application Priority Data

Mar. 31, 2021 (JP) ................................ 2021-061728

(51) Int. Cl.
*H10H 20/85* (2025.01)
*H10H 20/84* (2025.01)

(52) U.S. Cl.
CPC ........ *H10H 20/8506* (2025.01); *H10H 20/84* (2025.01)

(58) Field of Classification Search
None
See application file for complete search history.

(56) References Cited

U.S. PATENT DOCUMENTS

2004/0257797 A1* 12/2004 Suehiro .............. H10H 20/8515 362/34
2005/0169620 A1 8/2005 Minamio et al.
(Continued)

FOREIGN PATENT DOCUMENTS

JP H08-274289 A 10/1996
JP 2003-309272 A 10/2003
(Continued)

OTHER PUBLICATIONS

International Search Report and Written Opinion of the International Searching Authority issued in the corresponding International Patent Application No. PCT/JP2021/043388, dated Dec. 21, 2021.

*Primary Examiner* — Bilkis Jahan
(74) *Attorney, Agent, or Firm* — Foley & Lardner LLP

(57) ABSTRACT

A light-emitting device includes: a base body including: a sidewall part including a first upper surface, and a second upper surface, a periphery of the second upper surface being surrounded by the sidewall part; a light-emitting element located at the second upper surface; a bonding member located at the first upper surface; and a light-transmitting member including a lower surface, the lower surface including: a first region located above the first upper surface, and a second region located above the second upper surface. The light-transmitting member is bonded with a portion of the first upper surface by the bonding member. The light-emitting device includes a gap defined by the lower surface of the light-transmitting member, the first upper surface of the sidewall part, and the bonding member. The bonding member is bonded to the first and second regions of the lower surface of the light-transmitting member.

11 Claims, 9 Drawing Sheets

(56) References Cited

U.S. PATENT DOCUMENTS

| | | | | |
|---|---|---|---|---|
| 2009/0024000 | A1* | 1/2009 | Chen | A61B 1/00165 600/180 |
| 2009/0294940 | A1* | 12/2009 | Sugimoto | H10H 20/8581 257/680 |
| 2012/0062996 | A1* | 3/2012 | Kim | G02B 1/111 359/601 |
| 2014/0226308 | A1* | 8/2014 | Fukuda | F21K 2/00 362/267 |
| 2016/0247854 | A1* | 8/2016 | Chen | H10F 39/014 |
| 2017/0263833 | A1 | 9/2017 | Chiu et al. | |
| 2020/0185569 | A1 | 6/2020 | Cheng et al. | |
| 2021/0249567 | A1 | 8/2021 | Daido et al. | |
| 2024/0194834 | A1 | 6/2024 | Sannabe | |

FOREIGN PATENT DOCUMENTS

| | | | |
|---|---|---|---|
| JP | 2004-056061 | A | 2/2004 |
| JP | 2005-252223 | A | 9/2005 |
| JP | 2006-013175 | A | 1/2006 |
| JP | 2007-123444 | A | 5/2007 |
| JP | 2015-018873 | A | 1/2015 |
| JP | 2016-127056 | A | 7/2016 |
| JP | 2018-137428 | A | 8/2018 |
| JP | 2019-212695 | A | 12/2019 |
| JP | 2020-065052 | A | 4/2020 |
| JP | 2020-092265 | A | 6/2020 |
| JP | 2022-157477 | A | 10/2022 |
| KR | 2016-0146366 | A | 12/2016 |
| TW | 2020-23067 | A | 6/2020 |
| WO | WO-2022/208996 | A1 | 10/2022 |

* cited by examiner

LIGHT-EMITTING DEVICE

CROSS-REFERENCE TO RELATED APPLICATIONS

This application is a national stage of PCT Application No. PCT/JP2021/043388, filed on Nov. 26, 2021, which claims priority to Japanese Application No. 2021-061728, filed on Mar. 31, 2021.

BACKGROUND

The invention relates to a light-emitting device.

In light-emitting devices, a configuration is known in which a light-emitting element is located in a recess provided in a base body, and a light-transmitting member is bonded to the base body to cover the recess from above. See, for example, Japanese Patent Publication No. 2018-137428 A and Japanese Patent Publication No. 2020-92265 A.

SUMMARY

The invention is directed to a light-emitting device in which stress on a light-transmitting member can be relaxed.

According to one embodiment, a light-emitting device includes a base body including a sidewall part including a first upper surface, and a second upper surface, a periphery of the second upper surface being surrounded by the sidewall part; a light-emitting element located at the second upper surface; a bonding member located at the first upper surface; and a light-transmitting member including a lower surface, the lower surface including a first region located above the first upper surface, and a second region located above the second upper surface, the light-transmitting member being bonded with a portion of the first upper surface by the bonding member. The light-emitting device includes a gap defined by the lower surface of the light-transmitting member, the first upper surface of the sidewall part, and the bonding member. The gap extends out of the light-emitting device between the lower surface of the light-transmitting member and the first upper surface of the sidewall part from a space in which the light-emitting element is located. The bonding member is bonded to the first and second regions of the lower surface of the light-transmitting member.

According to a light-emitting device of the invention, stress on light-transmitting member can be relaxed.

DETAILED DESCRIPTION

Figure 1A:
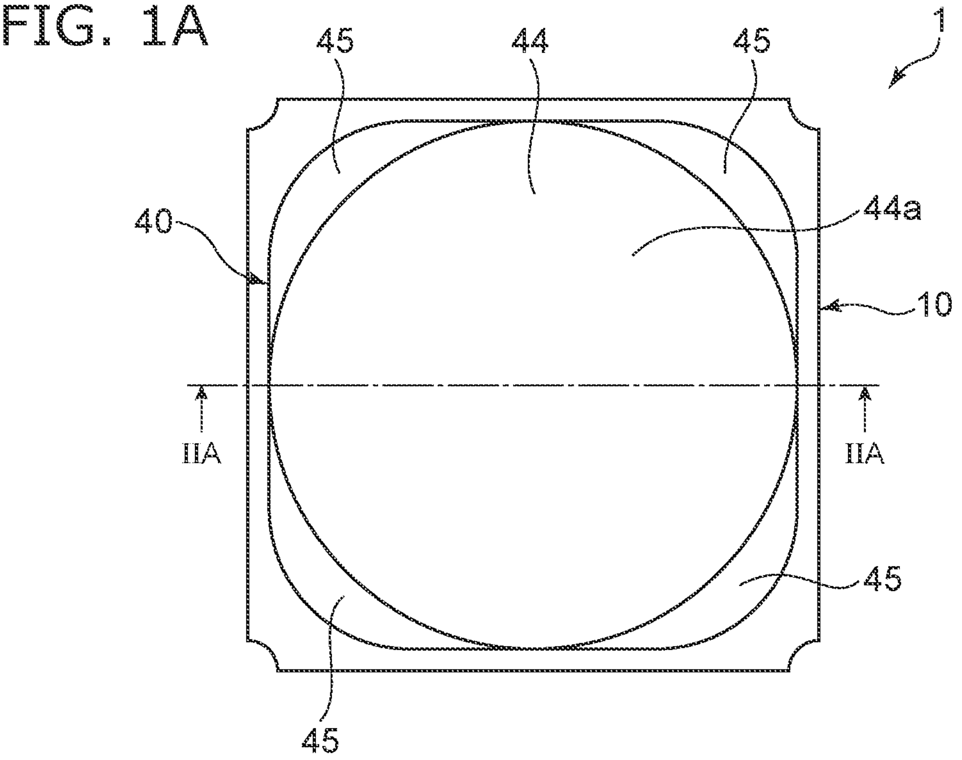
FIG. 1A is a schematic top view of a light-emitting device of an embodiment of the invention.

Embodiments will now be described with reference to the drawings. The same configurations are marked with the same reference numerals in the drawings. Because the drawings schematically show embodiments, the scales, spacing, positional relationships, and the like of the members may be exaggerated, or some of the members may not be illustrated, or end views that show only cross sections may be used as cross-sectional views.

First Embodiment

FIG. 1A is a schematic top view of a light-emitting device 1 of a first embodiment of the invention.

Figure 1B:
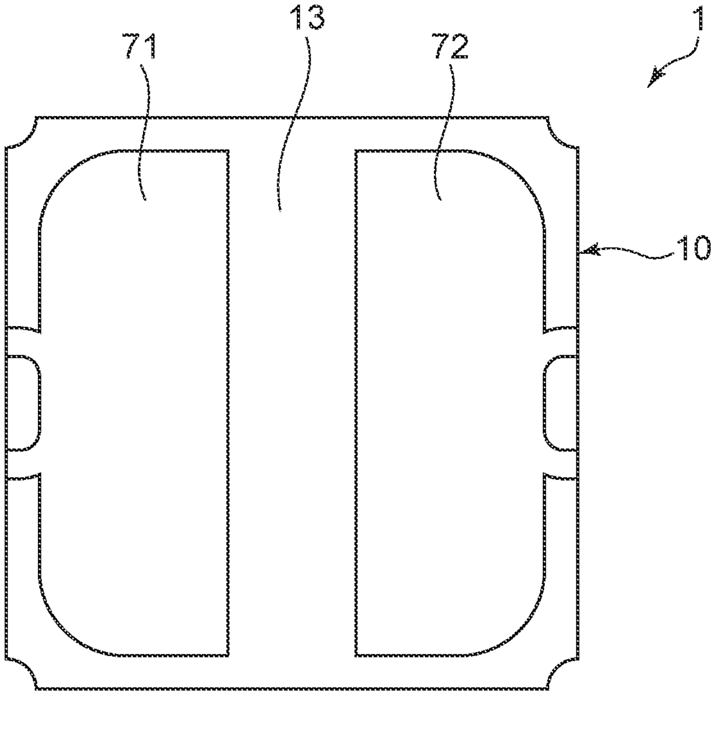
FIG. 1B is a schematic bottom view of the light-emitting device of the embodiment of the invention.

FIG. 1B is a schematic bottom view of the light-emitting device 1.

Figure 2A:
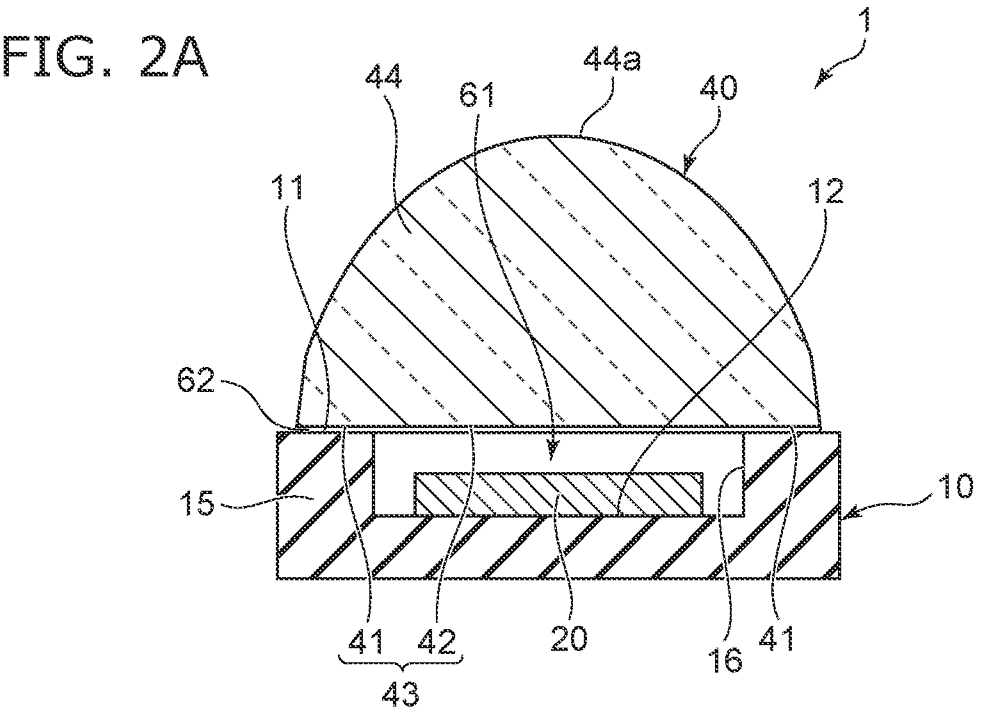
FIG. 2A is a schematic cross-sectional view along line IIA-IIA of FIG. 1.

FIG. 2A is a schematic cross-sectional view along line IIA-IIA of FIG. 1.

Figure 2B:
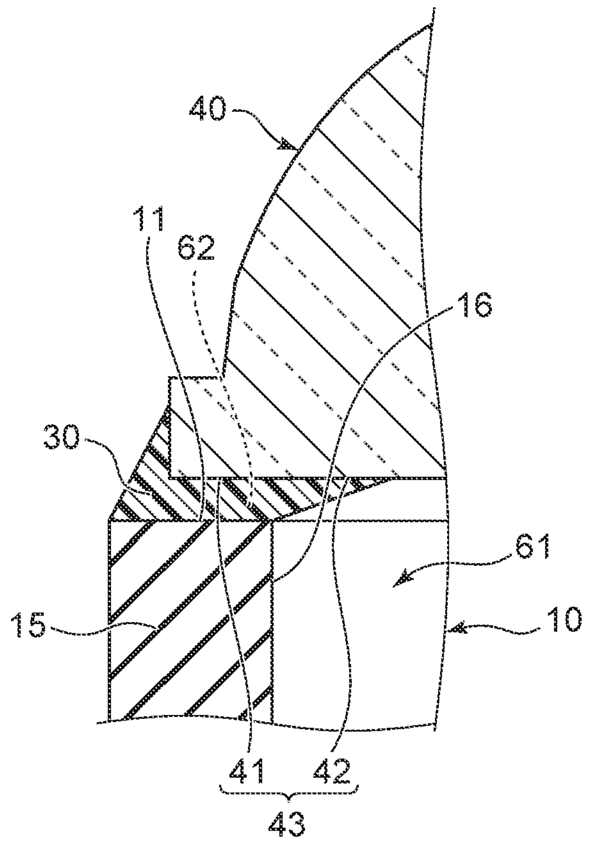
FIG. 2B is an enlarged schematic cross-sectional view showing a bonding member and parts around the bonding member of the light-emitting device of the embodiment of the invention.

FIG. 2B is an enlarged schematic cross-sectional view showing a bonding member and parts around the bonding member.

The light-emitting device 1 of the first embodiment of the invention includes a base body 10, a light-emitting element 20, a light-transmitting member 40, and a bonding member 30.

As shown in FIG. 2A, the base body 10 supports the light-emitting element 20. The base body 10 includes an insulative base material, a first lower surface wiring part 71, a second lower surface wiring part 72, a first upper surface wiring part 81, and a second upper surface wiring part 82. For example, the insulative base material is made of a ceramic. For example, aluminum nitride, aluminum oxide, and mullite are examples of the ceramic. The base body 10 includes a sidewall part 15 that includes a first upper surface 11, and a second upper surface 12 having a periphery surrounded by the sidewall part 15. A recess is defined by the second upper surface 12 and an inner wall surface 16 of the sidewall part 15. The second upper surface 12 is the bottom of the recess.

As shown in FIG. 1A, the base body 10 is substantially rectangular in a top view. "Substantially rectangular" refers to shapes that include four sides and four corner portions.

The corner portions can be right angles, rounded shapes, shapes having portions removed as in FIG. 1A, etc.

As shown in FIG. 1B, a lower surface 13 of the base body 10 includes the first lower surface wiring part 71 and the second lower surface wiring part 72. An anode potential is applied to one of the first lower surface wiring part 71 or the second lower surface wiring part 72, and a cathode potential is applied to the other of the first lower surface wiring part 71 or the second lower surface wiring part 72.

As shown in FIG. 2A, the light-emitting element 20 is located at the second upper surface 12 of the base body 10. The light-emitting element 20 is positioned inside a space 61 defined by the inner wall surface 16 of the sidewall part 15 of the base body 10, the second upper surface 12, and the light-transmitting member 40.

For example, the light-emitting element 20 emits ultra-violet light. For example, the light-emitting device 1 of the embodiment can be used in applications in which a resin material or a glass material is cured by ultraviolet light emitted by the light-emitting element 20. The light-emitting element 20 may emit visible light.

Figure 3:
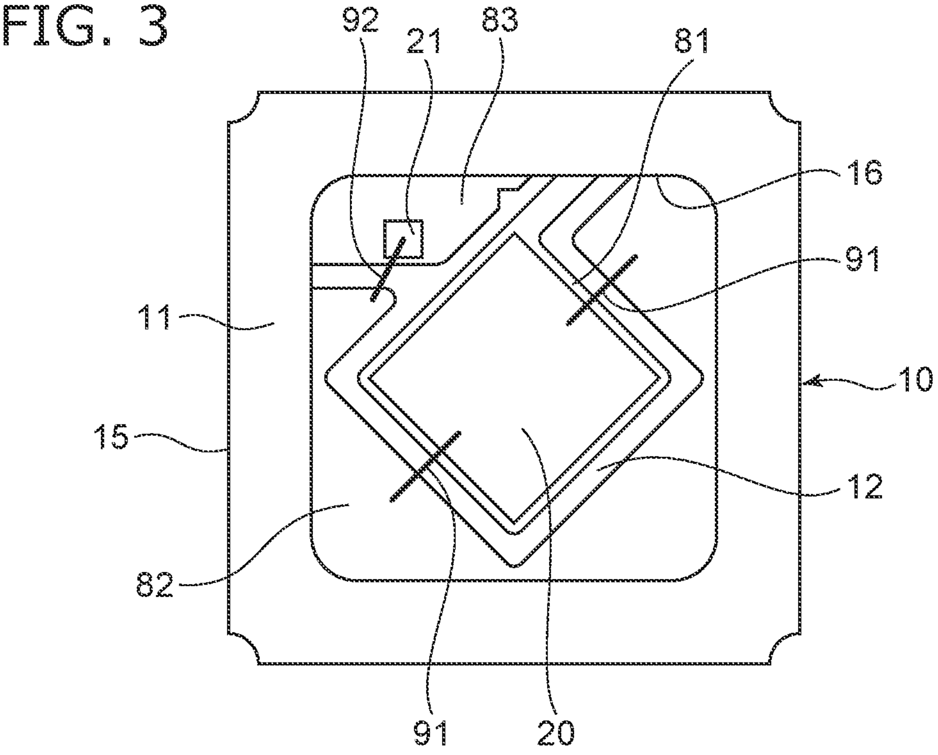
FIG. 3 is a top view of a base body and a light-emitting element.

FIG. 3 is a top view of the base body 10 and the light-emitting element 20.

The first upper surface wiring part 81, the second upper surface wiring part 82, and a third upper surface wiring part 83 are included at the second upper surface 12 of the base body 10. The light-emitting element 20 is located on the first upper surface wiring part 81. A lower surface electrode is located at the lower surface of the light-emitting element 20. For example, the lower surface electrode is bonded to the first upper surface wiring part 81 via solder or a conductive paste, and is electrically connected with the first upper surface wiring part 81.

Also, an upper surface electrode is located at the upper surface of the light-emitting element 20. The upper surface electrode is electrically connected with the second upper surface wiring part 82 via a metal wire (e.g., a Au wire). One of the first upper surface wiring part 81 or the second upper surface wiring part 82 is electrically connected with one of the first lower surface wiring part 71 or the second lower surface wiring part 72 located at the lower surface 13 of the base body 10, and the other of the first upper surface wiring part 81 or the second upper surface wiring part 82 is electrically connected with the other of the first lower surface wiring part 71 or the second lower surface wiring part 72.

An ESD (Electro Static Discharge) protection diode 21 is located on the third upper surface wiring part 83. The ESD protection diode 21 is, for example, a Zener diode. A lower surface electrode is formed at the lower surface of the ESD protection diode 21. For example, the lower surface electrode is bonded to the third upper surface wiring part 83 via solder or a conductive paste, and is electrically connected with the third upper surface wiring part 83. An upper surface electrode is formed at the upper surface of the ESD protection diode 21. The upper surface electrode is electrically connected with the second upper surface wiring part 82 via a metal wire (e.g., a Au wire). The third upper surface wiring part 83 is electrically connected with the lower surface wiring part among the first lower surface wiring part 71 or the second lower surface wiring part 72 that is connected with the first upper surface wiring part 81.

As shown in FIG. 2A, the light-transmitting member 40 is located on the base body 10 to cover the space 61 in which the light-emitting element 20 is located from above. The light-transmitting member 40 protects the light-emitting element 20 from the outside. The light-transmitting member 40 is light-transmissive to the light emitted by the light-emitting element 20. The light-transmitting member 40 is made of glass (e.g., borosilicate glass), sapphire, etc.

The light-transmitting member 40 that is used can be able to function as a lens that condenses or diffuses the light emitted by the light-emitting element 20. An example of such a light-transmitting member 40*a* is a light-transmitting member 40 having a shape that includes a protrusion 44 as shown in FIG. 2A. Also, the light-transmitting member 40 shown in FIG. 1A includes a brim part 45. The brim part 45 is positioned between the outer perimeter of the protrusion 44 and the corner portions of the substantially rectangular base body 10 in a top view. Four brim parts 45 that correspond to the four corner portions of the base body 10 are provided. In the example shown in FIG. 2A, the light-transmitting member 40 has a shape including one protrusion 44 of which the upper surface is a convex surface. The light-transmitting member 40 may have a shape including one recess in which the upper surface is a concave surface, or may be flat. Multiple protrusions and recesses may be provided.

As shown in FIG. 2A, a lower surface 43 of the light-transmitting member 40 includes a first region 41 that is located above the first upper surface 11 of the base body 10, and a second region 42 that is located above the second upper surface 12. The second region 42 faces the upper surface of the light-emitting element 20 via the space As described below, the lower surface 43 of the light-transmitting member 40 is bonded with a portion of the first upper surface 11 of the base body 10 by the bonding member 30. In other words, between the lower surface 43 of the light-transmitting member 40 and the first upper surface 11 of the base body 10, there are parts at which the bonding member 30 is provided, and parts at which the bonding member 30 is not provided. FIG. 2A is a cross-sectional view of the entire light-emitting device 1, and includes a part at which the bonding member 30 is not provided. FIG. 2B is an enlarged cross-sectional view of a part at which the bonding member 30 is provided.

Figure 4:
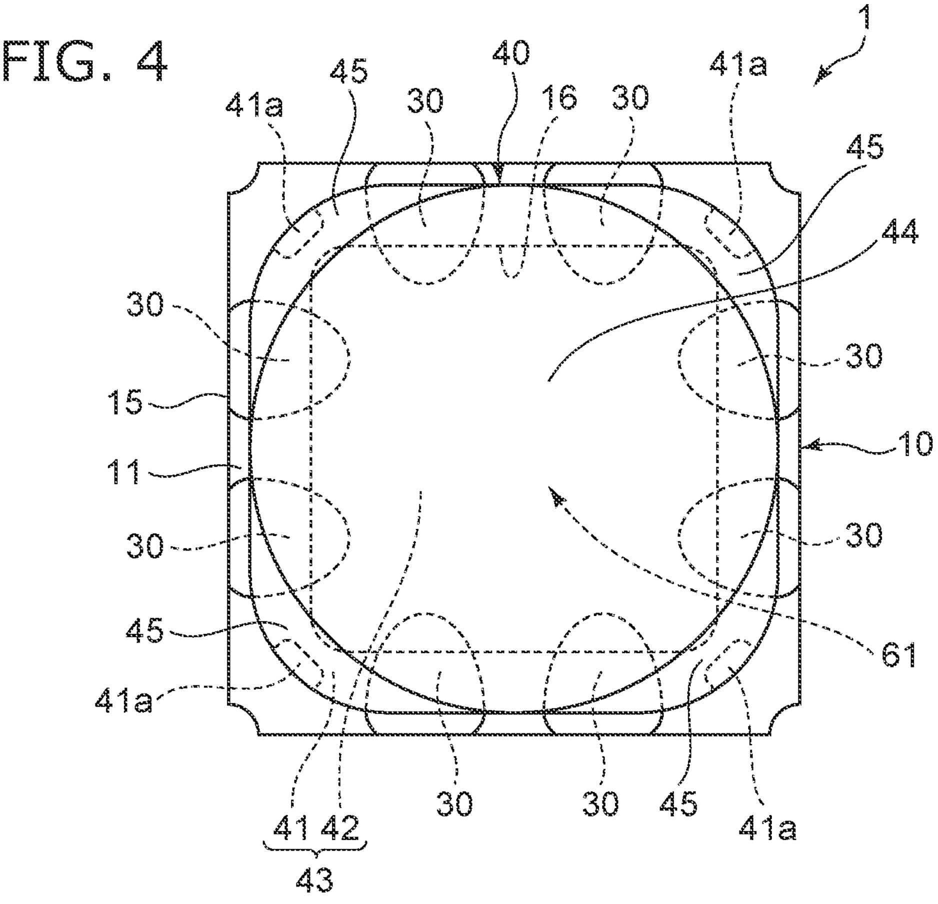
FIG. 4 is a top view showing an arrangement example of the bonding members of the light-emitting device of the embodiment of the invention.

FIG. 4 is a top view showing an arrangement example of the bonding members 30 of the light-emitting device 1 of the embodiment. In FIG. 4, the inner wall surface 16 of the sidewall part 15 of the base body 10 is illustrated by a broken line. In other words, the broken line is also the boundary between the first region 41 and the second region 42 of the light-transmitting member 40 in a top view.

The bonding member 30 is, for example, a thermosetting resin member. The bonding member 30 is disposed on the first upper surface 11 of the base body 10 in the uncured state. The multiple bonding members 30 are located on the first upper surface 11 and separated from each other along the sides of the base body 10 in a plan view. The area of the first upper surface 11 occupied by the bonding member 30 is not particularly limited as long as the bonding strength between the light-transmitting member 40 and the base body 10 can be ensured. It is favorable for the ratio of the area of the first upper surface 11 occupied by the bonding member 30 to be, for example, not less than 20% and not more than 80%.

A method of bonding the light-transmitting member 40 and the base body 10 with the bonding member 30 will now be described. After the bonding member 30 is disposed at the first upper surface 11, the light-transmitting member 40 is located on the base body 10 so that the lower surface 43 of the light-transmitting member 40 faces the tops of the first upper surface 11 and the space 61. The uncured bonding member 30 is located between the lower surface 43 of the light-transmitting member 40 and the first upper surface 11 of the base body 10. At this time, a portion of the uncured bonding member 30 mashed between the lower surface 43 of the light-transmitting member 40 and the first upper surface 11 of the base body 10 spreads to the second region 42 of the light-transmitting member 40. Subsequently, for example, the bonding member 30 is cured by heating.

There are also cases where the bonding member 30 in the uncured state wets from the first upper surface 11 to the side surface of the light-transmitting member 40. In such a case, the bonding member 30 after curing forms a so-called fillet as shown in FIG. 2B. Accordingly, the bonding force between the light-transmitting member 40 and the first upper surface 11 of the base body 10 can be stronger.

Figure 11:
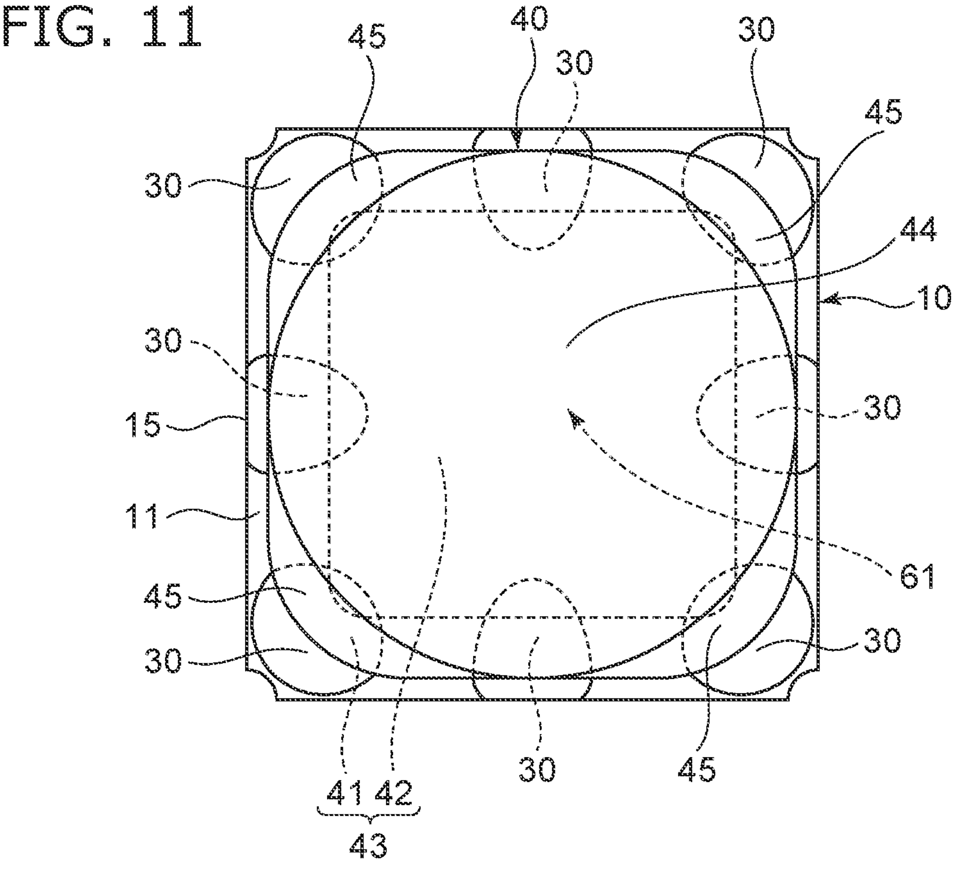
FIG. 11 is a top view showing an arrangement example of the bonding members of the light-emitting device of the embodiment of the invention.

Although two bonding members 30 are provided per side of the base body 10 in the example shown in FIG. 4, one, three, or more bonding members 30 may be provided per side of the base body 10. Also, two bonding members 30 adjacent to each other in the direction along the side of the base body 10 may be partially connected to each other. In the example shown in FIG. 4, the bonding member 30 is not provided at the four corners of the substantially rectangular base body 10 or on the perpendicular bisectors of the sides of the base body 10. Also, as shown in FIG. 11, the bonding member 30 may be located at the four corners of the substantially rectangular base body 10 and the centers of the sides of the base body 10.

The bonding member 30 is bonded to the first upper surface 11 of the base body 10 and the first region 41 of the lower surface 43 of the light-transmitting member 40 facing the first upper surface 11. Also, the bonding member 30 is bonded to a portion of the second region 42. The bonding member 30 that is bonded to a portion of the second region 42 is positioned at the upper side inside the space 61. It is favorable for the bonding member 30 not to be located in the region of the second region 42 positioned above the light-emitting element 20. For example, in the example shown in FIG. 3, the rectangular light-emitting element 20 is provided to be rotated 45 degrees with respect to the rectangular base body 10 in a top view. The corner portions of the four corners of the light-emitting element 20 are respectively located on the perpendicular bisectors of the sides of the base body 10. In contrast, the bonding member 30 is not provided on the perpendicular bisectors of the sides of the base body 10. The light from the light-emitting element 20 that is incident on the bonding member 30 can be reduced thereby.

The bonding member 30 is provided partially rather than over the entire surface of the first upper surface 11. By such a partial arrangement of the bonding member 30, in the parts at which the bonding member 30 is not provided, a gap 62 defined by the lower surface 43 of the light-transmitting member 40, the first upper surface 11 of the sidewall part 15, and the bonding member 30 is included between the lower surface 43 of the light-transmitting member 40 and the first upper surface 11 of the base body 10 as shown in FIG. 2A. The gap 62 extends out of the light-emitting device 1 from the space 61 in which the light-emitting element 20 is located. In other words, the space 61 in which the light-emitting element 20 is located is a non-airtight space with respect to the outside of the light-emitting device 1. In the example shown in FIG. 4, three gaps 62 are provided per side of the base body 10. Also, one, two, four, or more gaps 62 may be provided per side of the base body 10. The height of the gap 62 (the thickness of the bonding member 30 between the first upper surface 11 of the sidewall part 15 and the light-transmitting member 40) can be, for example, not less than 1 μm and not more than 100 μm. It is favorable for the height of the gap 62 to be not less than 10 μm and not more than 50 μm. When a first coating film 51 described below is included, the height of the gap 62 refers to the thickness of the bonding member 30 between the first upper surface 11 of the sidewall part 15 and the lower surface of the first coating film 51.

According to the embodiment, by partially providing the bonding member 30 on the first upper surface 11, the stress applied to the light-transmitting member 40 can be relaxed compared to when the bonding member 30 is provided over the entire surface of the first upper surface 11.

Also, the bonding member 30 is located not only at the first region 41 of the lower surface 43 of the light-transmitting member 40 positioned above the first upper surface 11 of the base body 10 but also at the second region 42 positioned above the second upper surface 12 with the space 61 interposed. The contact area between the bonding member 30 and the lower surface 43 of the light-transmitting member 40 can be increased thereby, and the bonding force between the bonding member 30 and the light-transmitting member 40 can be increased. In other words, the bonding force between the light-transmitting member 40 and the base body 10 via the bonding member 30 can be increased.

Also, as shown in FIG. 4, the multiple bonding members 30 include the bonding members 30 positioned with the center of the lower surface 43 of the light-transmitting member 40 interposed in a plan view. In other words, it is favorable for the bonding members 30 not to be unbalanced in specific regions along the outer perimeter of the base body 10. Also, it is favorable for the parts at which the bonding members 30 are not provided not to be unbalanced in specific regions along the outer perimeter of the base body 10. Accordingly, in particular, the application of excessive stress on the bonding part between the light-transmitting member 40 and the base body 10 is easily suppressed, and a stable bonding state is easily maintained.

As described below, the first coating film is provided at the lower surface 43 of the light-transmitting member 40.

Figure 5:
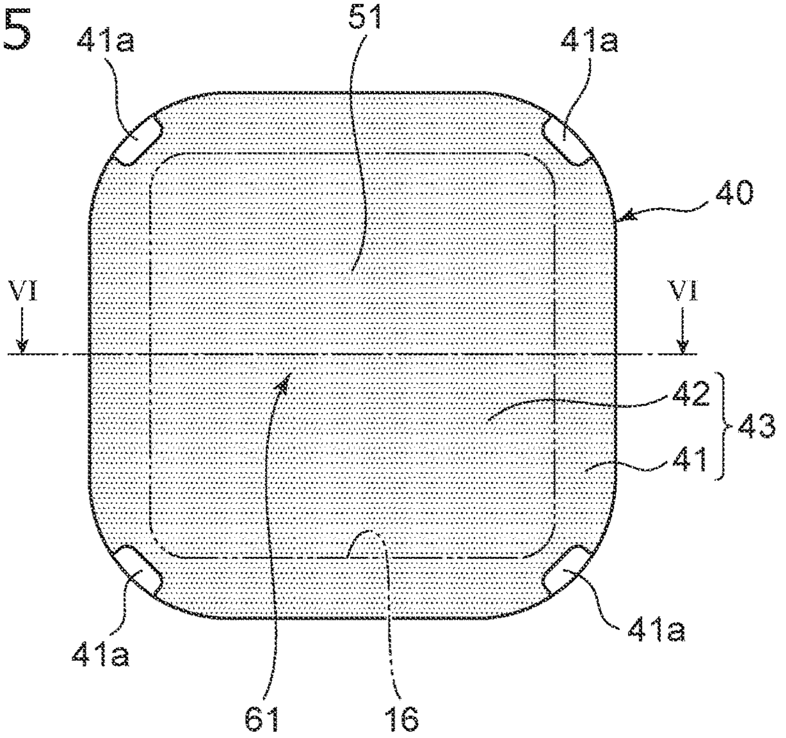
FIG. 5 is a bottom view of a light-transmitting member of the embodiment of the invention.

FIG. 5 is a bottom view of the light-transmitting member 40.

In FIG. 5, the first coating film 51 is illustrated by a filled-in part. Also, in FIG. 5, the boundary between the first region 41 and the second region 42 (the part at which the inner wall surface 16 of the sidewall part 15 of the base body 10 is positioned) is illustrated by a double dot-dash line.

Figure 6:
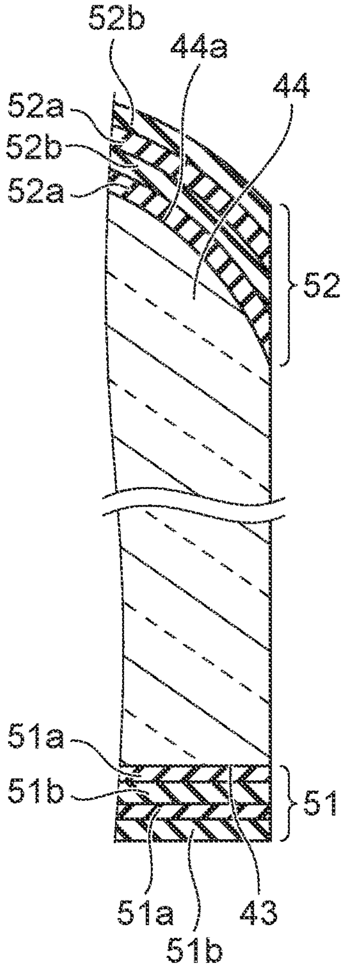
FIG. 6 is an enlarged schematic cross-sectional view partially showing the light-transmitting member of the embodiment of the invention.

FIG. 6 is an enlarged schematic cross-sectional view partially showing the light-transmitting member 40.

The bonding force between the first coating film 51 and the bonding member 30 is greater than the bonding force between the light-transmitting member 40 and the bonding member 30. In other words, the affinity between the material of the outermost surface of the first coating film 51 and the material of the bonding member 30 is greater than the affinity between the material of the light-transmitting member 40 and the material of the bonding member 30. Accordingly, the bonding force between the light-transmitting member 40 and the base body 10 via the bonding member 30 can be greater than when the bonding member 30 is bonded to the light-transmitting member 40 without the first coating film 51 interposed. The improvement effects of the bonding force described above can be obtained by providing the first coating film 51 in at least the first region 41. For example, a single material or a metal layer made of composite materials of gold (Au), silver (Ag), copper (Cu), nickel (Ni), titanium (Ti), chrome (Cr), tin (Sn), aluminum (Al), palladium (Pd), platinum (Pt), rhodium (Rh), tungsten (W), molybdenum (Mo), iron (Fe), and the like, at least one type of oxide selected from the group consisting of titanium oxide ($TiO_2$), zirconium oxide ($ZrO_2$), tantalum oxide ($TaO_2$), and silicon oxide ($SiO_2$), etc., are examples of the first coating film 51.

In the example shown in FIG. 5, the first coating film 51 is located at the entire surface of the second region 42 of the lower surface 43 of the light-transmitting member 40 and at the greater part of the first region 41. It is favorable for the ratio of the area of the first region 41 occupied by the first coating film 51 to be, for example, not less than 70% and not more than 95%.

The first coating film 51 can be an anti-reflection coating that suppresses reflections of the light from the light-emitting element 20 by the lower surface 43 of the light-transmitting member 40 and causes the light from the light-emitting element 20 to efficiently enter the light-transmitting member 40.

When the first coating film 51 is an anti-reflection coating, for example, the first coating film 51 can be a multilayer film in which a first film 51*a* and a second film 51*b* having mutually-different refractive indexes are alternately stacked. In such a case, the first film 51*a* and the second film 51*b* are alternately stacked in this order from the lower surface 43 side of the light-transmitting member 40, and the outermost surface of the first coating film 51 is the second film 51*b*. For example, the first film 51*a* is tantalum oxide ($Ta_2O_5$), and the second film 51*b* is silicon oxide ($SiO_2$). Accordingly, the outermost surface of the first coating film 51 is silicon oxide.

The bonding member 30 is bonded with the light-transmitting member 40 via the outermost surface (the second film 51*b*) of the first coating film 51. The affinity between the resin of the bonding member 30 and the second film 51*b* that is the outermost surface of the first coating film 51 is greater than the affinity between the material of the light-transmitting member 40 and the resin of the bonding member 30. The bonding force between the light-transmitting member 40 and the base body 10 can be increased thereby.

As shown in FIG. 5, there is a part 41*a* of the first region 41 of the lower surface 43 of the light-transmitting member 40 at which the first coating film 51 is not provided. The multiple parts 41*a* at which the first coating film 51 is not provided are positioned with the center of the lower surface 43 interposed in a plan view. For example, as shown in FIG. 4, the parts 41*a* at which the first coating film 51 is not provided are positioned at the lower surface of the brim part 45 of the light-transmitting member 40. In other words, the parts 41*a* at which the first coating film 51 is not provided are positioned at the four corners of the substantially rectangular base body 10.

The brim part 45 of the light-transmitting member 40 and the four corners of the base body 10 each include parts at which the bonding member 30 is not provided. The glass included in the light-transmitting member 40 is exposed at the parts 41*a* of the lower surface 43 of the light-transmitting member 40 at which the first coating film 51 is not provided. The bonding member 30 is not provided at the exposed portions of the glass, which has a lower affinity with the bonding member 30 than the first coating film 51.

The light from the light-emitting element 20 enters the light-transmitting member 40 through the second region 42 of the lower surface 43 of the light-transmitting member 40 facing the space 61 in which the light-emitting element 20 is located. Accordingly, when functioning as an anti-reflection coating, it is favorable for the first coating film 51 to be located in at least the second region 42. According to the embodiment, by forming the first coating film 51 at the entire surface of the second region 42, the light from the light-emitting element 20 can efficiently enter the light-transmitting member 40 over the entire surface of the second region 42. Accordingly, for example, the light extraction efficiency of the light-emitting device 1 can be improved 2 to 4%.

The first region 41 of the light-transmitting member 40 that faces the first upper surface 11 of the base body 10 is a region for bonding to the base body 10 via the bonding member 30, where the light from the light-emitting element 20 is substantially not incident on the light-transmitting member 40 via the first region 41. Accordingly, from the perspective of the function as an anti-reflection coating, the first coating film 51 is unnecessary at the first region 41.

However, according to the embodiment as described above, the first coating film 51 is formed also at the first region 41 to increase the affinity with the bonding member 30. In other words, the first coating film 51 that is formed in the first region 41 functions as an adhesion film that increases the adhesion with the bonding member 30. A film that has an anti-reflection function and good adhesion can be formed on the lower surface 43 of the light-transmitting member 40 with one film formation process as described below.

However, because the first coating film 51 is not provided at the entire surface of the first region 41, the part 41*a* of the first region 41 exists where the first coating film 51 is not provided. Accordingly, compared to when the first coating film 51 is provided at the entire surface of the first region 41, the stress on the light-transmitting member 40 can be relaxed, and delamination of the first coating film 51 from the lower surface 43 of the light-transmitting member 40 can be suppressed.

Also, by positioning the parts 41*a* at which the first coating film 51 is not provided with the center of the lower surface 43 interposed in a plan view, the bias of the stress on the light-transmitting member 40 can be suppressed, and the stress can be effectively relaxed. For example, in the example shown in FIGS. 4 and 5, the parts 41*a* at which the first coating film 51 is not provided are not located at the region of the first region 41 positioned below the protrusion 44. The parts 41*a* at which the first coating film 51 is not provided are located at parts of the four brim parts 45 at the four corners of the substantially rectangular base body 10. By providing the parts 41*a* at which the first coating film 51 is not provided at such positions, the bias of the stress on the light-transmitting member 40 can be suppressed, and the stress can be effectively relaxed. The ratio of the area of the first region 41 occupied by the parts 41*a* at which the first coating film 51 is not provided is not particularly limited as long as the bonding strength between the light-transmitting member 40 and the base body 10 can be ensured.

As shown in FIG. 6, a second coating film 52 that functions as an anti-reflection coating can be located at an upper surface 44*a* of the light-transmitting member 40 (the upper surface of the protrusion 44). The second coating film 52 suppresses reflections at the interface between the upper surface 44*a* of the light-transmitting member 40 and the outside of the light-transmitting member 40 (the air), and increases the light extraction efficiency to the outside from the upper surface 44*a* of the light-transmitting member 40.

The second coating film 52 includes a third film 52*a* and a fourth film 52*b* that have mutually-different refractive indexes and are alternately stacked. The third film 52*a* and the fourth film 52*b* are alternately stacked in this order from the upper surface 44*a* side of the light-transmitting member 40, and the outermost surface of the second coating film 52 is the fourth film 52*b*. For example, the third film 52*a* is tantalum oxide ($Ta_2O_5$), and the fourth film 52*b* is silicon oxide ($SiO_2$). Accordingly, the outermost surface of the second coating film 52 is silicon oxide.

When formed only at the first region 41 of the lower surface 43 of the light-transmitting member 40, for example, the first coating film 51 can be formed by a method such as sputtering, vapor deposition, etc., using a mask.

Methods of forming the first coating film 51 and the second coating film 52 on the light-transmitting member 40 will now be described with reference to FIGS. 7 to 9.

Figure 7:
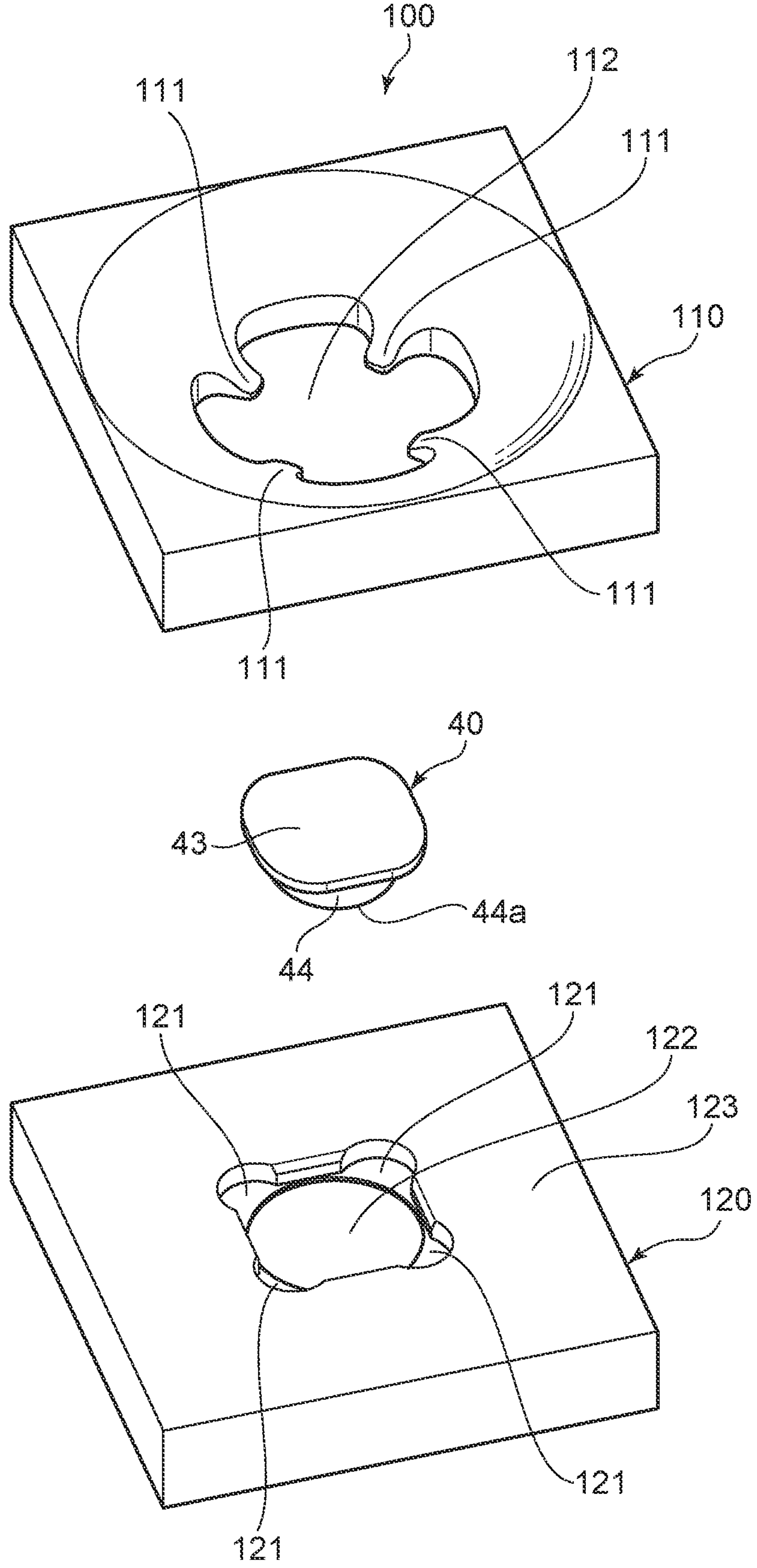
FIG. 7 is an exploded perspective view schematically showing a jig for forming a first coating film on the light-transmitting member of the embodiment of the invention.

FIG. 7 is an exploded perspective view schematically showing a jig 100 for forming the first coating film 51 and the second coating film 52 on the light-transmitting member 40.

Figure 8A:
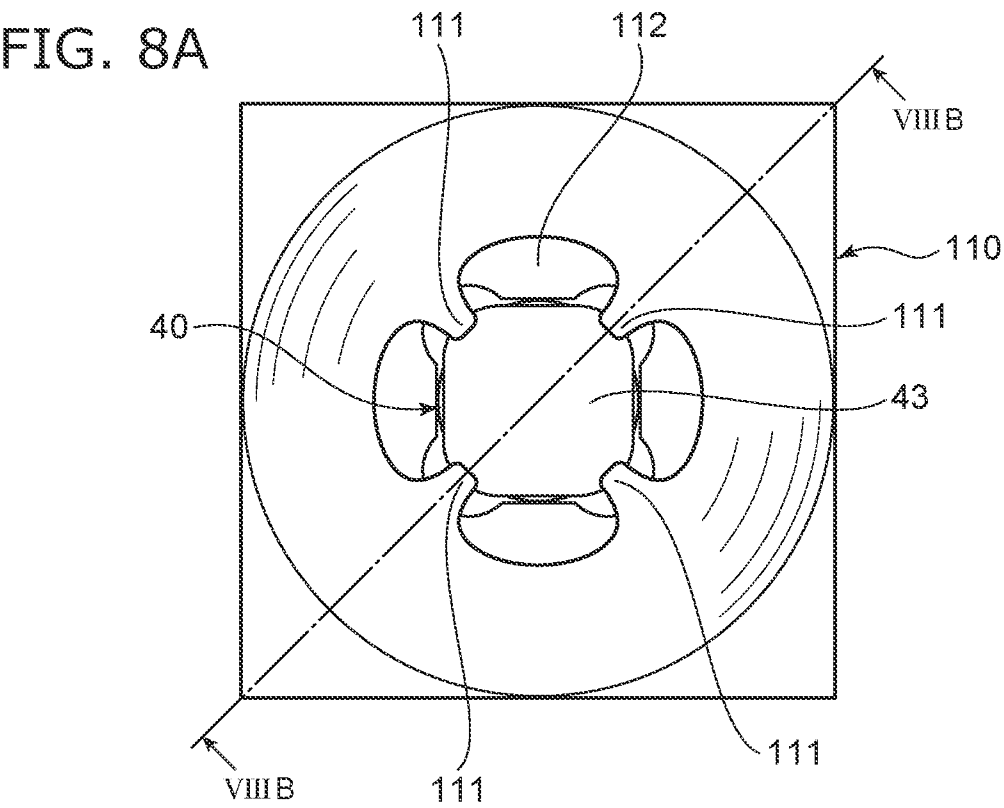
FIG. 8A is a schematic bottom view of the jig shown in FIG. 7 and the light-transmitting member housed in the jig.

FIG. 8A is a schematic bottom view of the jig 100 and the light-transmitting member 40 to be housed in the jig 100.

Figure 8B:
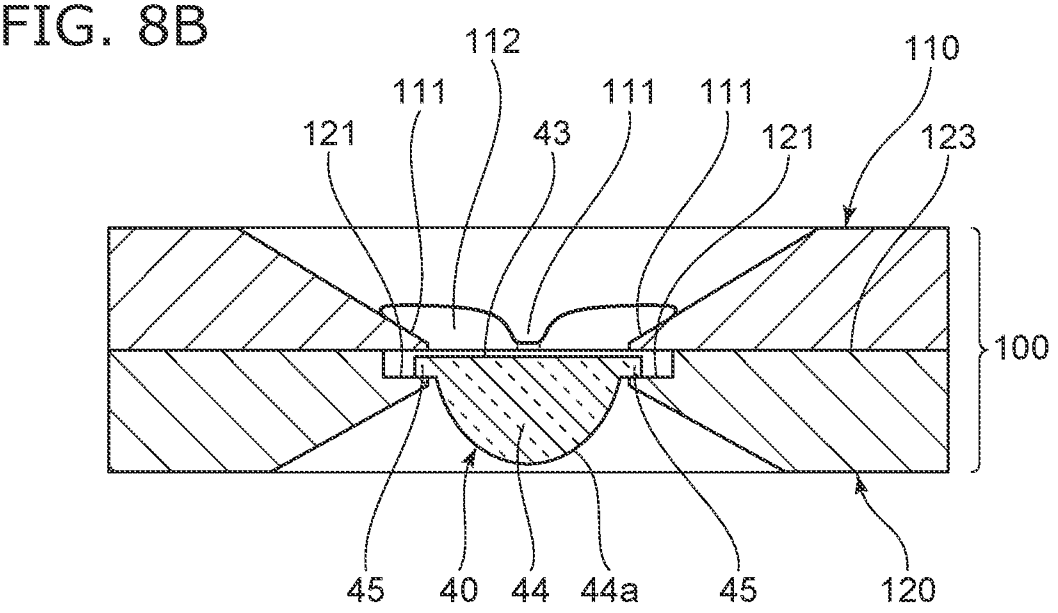
FIG. 8B is a schematic cross-sectional view along line VIIIB-VIIIB of FIG. 8A.

FIG. 8B is a schematic cross-sectional view along line VIIIB-VIIIB of FIG. 8A.

Figure 9:
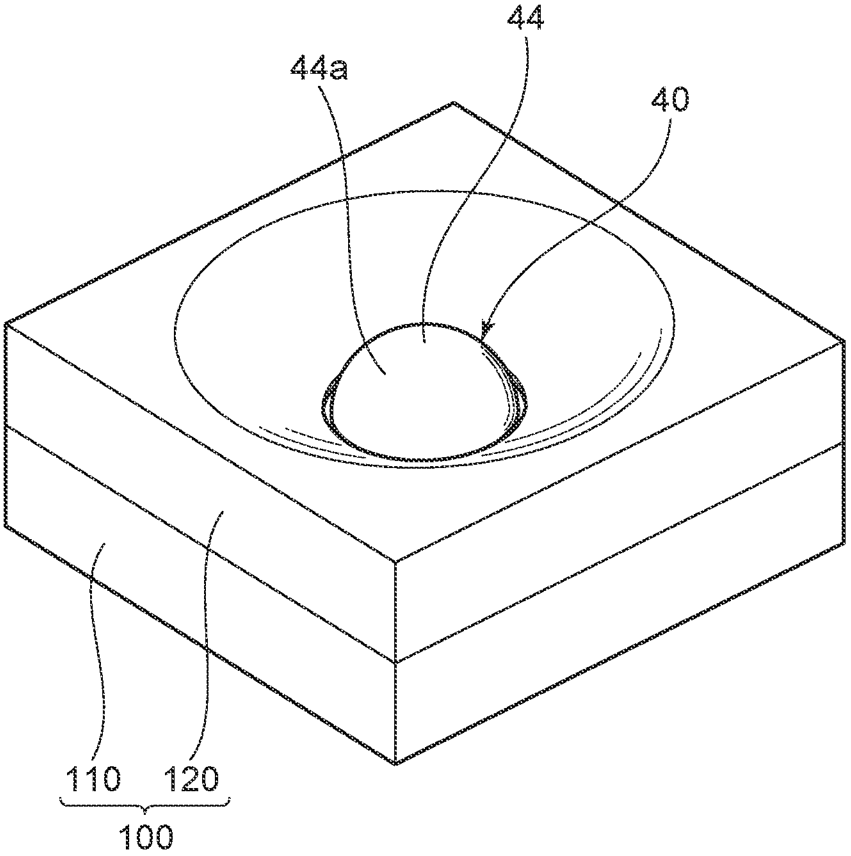
FIG. 9 is a schematic perspective view of the jig and an upper surface side of the light-transmitting member housed in the jig.

FIG. 9 is a schematic perspective view of the jig 100 and the upper surface 44*a* side of the light-transmitting member 40 housed in the jig 100. The material of the jig 100 is not particularly limited as long as the light-transmitting member 40 can be held. The jig 100 can include, for example, brass, stainless steel, etc.

The jig 100 includes a first member 110 and a second member 120 that are each plate-shaped. A first through-hole 112 is formed in the center of the first member 110. Four tab parts 111 that extend from the inner perimeter portion of the first through-hole 112 toward the center of the first through-hole 112 in a plan view are provided in the first member 110.

A second through-hole 122 is formed in the center of the second member 120. Four recessed supporters 121 in which steps are formed from a surface 123 of the second member 120 are provided in the periphery of the second through-hole 122.

As shown in FIG. 8B, the light-transmitting member 40 is located between the first member 110 and the second member 120. The surface of the light-transmitting member 40 at the protrusion 44 side of the brim part 45 is located on the supporter 121 of the second member 120. The protrusion 44 is exposed in the second through-hole 122.

The first member 110 is overlaid on the surface 123 of the second member 120. As shown in FIG. 8A, the tab parts 111 of the first member 110 cover and conceal a portion of the lower surface 43 of the light-transmitting member 40 in a plan view of the lower surface 43 of the light-transmitting member 40. The greater part of the lower surface 43 of the light-transmitting member 40 other than the portion covered and concealed by the tab parts 111 is exposed in the first through-hole 112. The first coating film 51 is formed on the lower surface 43 of the light-transmitting member 40 in this state.

Accordingly, as shown in FIG. 5, the first coating film 51 is not formed at the parts 41*a* of the lower surface 43 of the light-transmitting member 40, and the first coating film 51 is formed at the parts other than the parts 41*a*. The parts 41*a* of the lower surface 43 of the light-transmitting member 40 at which the first coating film 51 is not formed are the parts covered and concealed by the tab parts 111 of the first member 110 in FIG. 8A.

The upper surface 44*a* of the protrusion 44 is exposed from under the second member 120 as shown in FIG. 9. The second coating film 52 is formed on the upper surface 44*a* of the protrusion 44 in this state. At this time, the tab part 111 of the first member 110 prevents the light-transmitting member 40 from falling out from the first member 110 side.

Second Embodiment

Figure 10A:
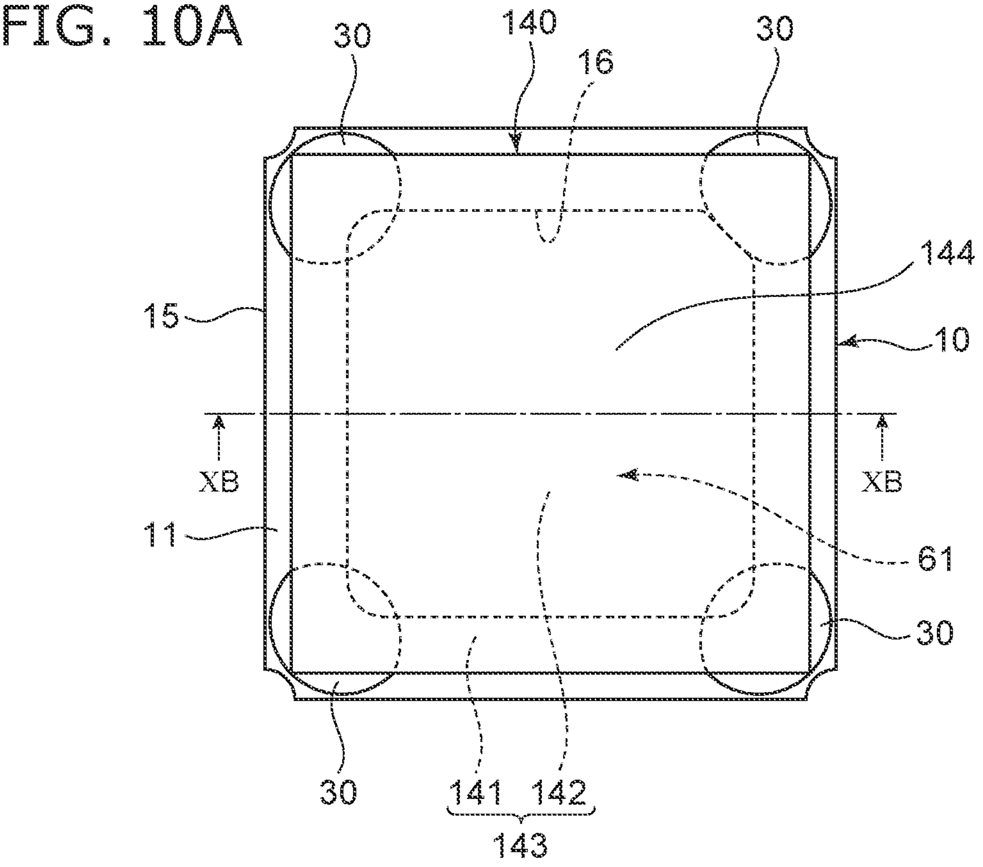
FIG. 10A is a top view showing an arrangement example of the bonding members of a light-emitting device of an embodiment of the invention.

FIG. 10A is a top view showing an arrangement example of the bonding member 30 in a light-emitting device of a second embodiment.

Figure 10B:
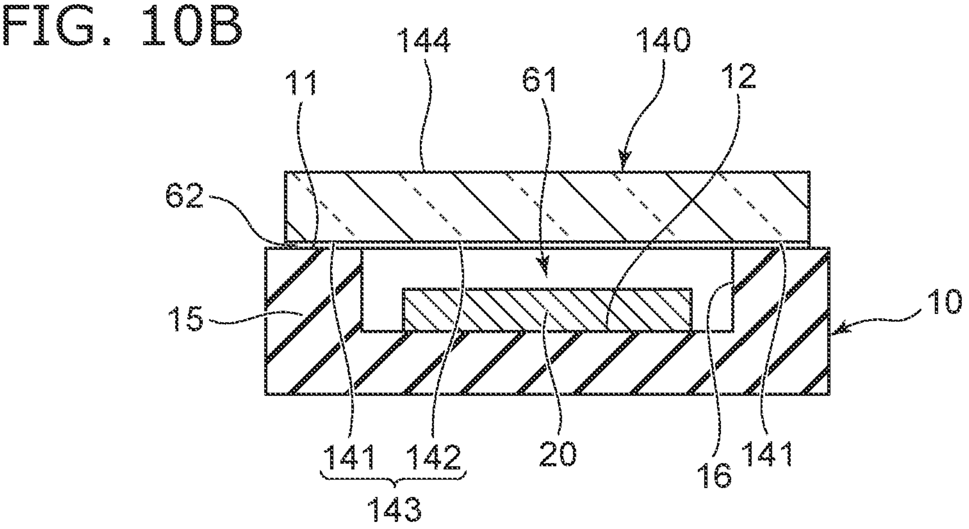
FIG. 10B is a schematic cross-sectional view along line XB-XB of FIG. 10A.

FIG. 10B is a schematic cross-sectional view along line XB-XB of FIG. 10A.

In the example shown in FIG. 10B, the upper surface of a light-transmitting member 140 is a flat surface. As shown in FIG. 10A, the bonding members 30 are positioned at the four corners of the substantially rectangular base body 10. Also, the bonding members 30 are located not only at a first region 141 of a lower surface 143 of the light-transmitting member 140 positioned above the first upper surface 11 of the base body 10 but also at a second region 142 positioned above the second upper surface 12 of the base body 10 with the space 61 interposed. In the light-emitting device of the embodiment as well, the stress on the light-transmitting member 140 can be relaxed, and a stable bonding state can be maintained.

Hereinabove, exemplary embodiments of the invention are described with reference to specific examples. However, the invention is not limited to these specific examples. All configurations practicable by an appropriate design modification by one skilled in the art based on the embodiments of the invention described above also are within the scope of the invention to the extent that the purport of the invention is included. Furthermore, various modifications and alterations within the spirit of the invention will be readily apparent to those skilled in the art, and all such modifications and alterations also are within the scope of the invention.

REFERENCE NUMERAL LIST

1 light-emitting device
10 base body
11 first upper surface
12 second upper surface
15 sidewall part
20 light-emitting element
30 bonding member
40 light-transmitting member
41 first region
42 second region
43 lower surface
44 protrusion
44*a* upper surface
51 first coating film
51*a* first film
51*b* second film
52 second coating film
52*a* third film
52*b* fourth film
61 space
62 gap

The invention claimed is:

1. A light-emitting device comprising:

a base body comprising:

a sidewall part including a first upper surface, a second upper surface, a periphery of the second upper surface being surrounded by the sidewall part, and an inner lateral surface extending between the first upper surface and the second upper surface;

a light-emitting element located at the second upper surface;

a bonding member located at the first upper surface; and a light-transmitting member including a lower surface, the lower surface including:

a first region located above the first upper surface, and a second region located above the second upper surface, wherein:

the light-transmitting member is bonded with a portion of the first upper surface by the bonding member, the light-emitting device includes a space defined between the second upper surface of the base body, the second region of the lower surface of the light-transmitting member, and the inner lateral surface of the base body, the light-emitting element located within the space;

the light-emitting device includes a gap defined by the lower surface of the light-transmitting member, the first upper surface of the sidewall part, and the bonding member, the gap extending out of the light-emitting device between the lower surface of the light-transmitting member and the first upper surface of the sidewall part from the space, and the bonding member is bonded to the first and second regions of the lower surface of the light-transmitting member.

2. The light-emitting device according to claim 1, comprising:

a plurality of the bonding members.

3. The light-emitting device according to claim 2, wherein:

in a plan view, the bonding members are positioned with a center of the lower surface of the light-transmitting member interposed therebetween.

4. The light-emitting device according to claim 1, further comprising:

a first coating film located at the second region and at a portion of the first region of the lower surface of the light-transmitting member, the first coating film having a higher bonding force with the bonding member than with the light-transmitting member, and the bonding member is bonded with the light-transmitting member by the first coating film.

5. The light-emitting device according to claim 4, wherein:

the first coating film is an anti-reflection coating.

6. The light-emitting device according to claim 4, wherein:

an outermost surface of the first coating film is silicon oxide.

7. The light-emitting device according to claim 4, wherein:

in a plan view, parts of the first region of the lower surface of the light-transmitting member at which the first coating film is not provided are positioned with a center of the lower surface interposed.

8. The light-emitting device according to claim 4, wherein:

in a plan view, the base body is substantially rectangular, and parts at which the first coating film is not provided are positioned at four corners of the substantially rectangular base body.

9. The light-emitting device according to claim 4, further comprising:

a second coating film located at an upper surface of the light-transmitting member.

10. The light-emitting device according to claim 9, wherein:

the second coating film is an anti-reflection coating.

11. The light-emitting device according to claim 1, wherein:

the light-transmitting member is made of glass.

* * * * *